United States Patent
Sheperek et al.

(10) Patent No.: US 11,288,009 B2
(45) Date of Patent: Mar. 29, 2022

(54) READ SAMPLE OFFSET BIT DETERMINATION USING MOST PROBABLY DECODER LOGIC IN A MEMORY SUB-SYSTEM

(71) Applicant: Micron Technology, Inc., Boise, ID (US)

(72) Inventors: Michael Sheperek, Longmont, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 16/507,844

(22) Filed: Jul. 10, 2019

(65) Prior Publication Data

US 2021/0011656 A1    Jan. 14, 2021

(51) Int. Cl.
*G11C 16/12* (2006.01)
*G06F 3/06* (2006.01)
*G11C 16/26* (2006.01)
*G11C 16/34* (2006.01)

(52) U.S. Cl.
CPC .......... *G06F 3/0659* (2013.01); *G06F 3/0619* (2013.01); *G06F 3/0679* (2013.01); *G11C 16/26* (2013.01); *G11C 16/34* (2013.01); *G11C 16/3418* (2013.01); *G11C 16/3422* (2013.01); *G11C 2216/12* (2013.01)

(58) Field of Classification Search
CPC .......... G11C 16/10; G11C 16/34; G11C 5/04; G11C 16/3404; G11C 16/3459; G11C 11/5642; G11C 11/5628; G11C 2211/5625; G11C 2211/5623; G11C 2211/5624

See application file for complete search history.

(56) References Cited

U.S. PATENT DOCUMENTS

| | | | |
|---|---|---|---|
| 9,633,740 B1* | 4/2017 | Alhussien | H03M 13/1111 |
| 10,748,625 B1* | 8/2020 | Sheperek | G11C 11/5628 |
| 2014/0029336 A1* | 1/2014 | Venkitachalam | G11C 11/5642 365/185.03 |
| 2014/0281128 A1* | 9/2014 | Krishnan | G11C 11/5642 711/103 |
| 2015/0067444 A1* | 3/2015 | Eguchi | G06F 11/1048 714/766 |
| 2021/0011657 A1* | 1/2021 | Sheperek | G06F 3/0673 |
| 2021/0011801 A1* | 1/2021 | Liikanen | G06F 11/1048 |

* cited by examiner

*Primary Examiner* — Mushfique Siddique
(74) *Attorney, Agent, or Firm* — Lowenstein Sandler LLP (57) ABSTRACT

The present disclosure is directed to read sample offset most probable bit operation associated with a memory component. A processing device performs a first read, a second read, and a third read of data from the memory component using a center value corresponding to a read threshold voltage value, a negative offset value, and a positive offset value, respectively. The processing device performs a most probable bit operation on the first set of data, the second set of data, and the third set of data to generate a most probable bit sequence corresponding to the data associated with the memory component. The processing device can store or output the generated most probable bit sequence.

17 Claims, 6 Drawing Sheets

READ SAMPLE OFFSET BIT DETERMINATION USING MOST PROBABLY DECODER LOGIC IN A MEMORY SUB-SYSTEM

TECHNICAL FIELD

Embodiments of the disclosure relate generally to memory sub-systems, and more specifically, relate to read sample offset bit sequence determination in a memory sub-system.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to read sample offset most probable bit sequence determination in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Conventional memory sub-systems use an Error Correction Code (ECC) decoder to detect and correct a limited number of errors in data read from the memory components. ECC decoders have a correction capability that indicates that the ECC decoder cannot correct more than a specified number of bit errors present in data read from the memory sub-system. Parity information can be used to correct errors, but the parity information limits the number of errors that can be corrected.

A conventional memory sub-system can perform a read sample offset (RSO) operation in which multiple reads are performed on the data at varying offsets, generally referred to as left, right, and center samples. Conventional approaches to calibrating a read level threshold use read sample offsets, perform the multiple reads, determine an error count and identify an associated bit error rate (BER). Each of these reads of the RSO operation (also referred to as the left strobe, right strobe, and center strobe) is of the same data, with the left sample and the right sample captured at an offset relative to the center sample. Each strobe returns a bit error count (BEC or EC). For example, the center strobe can be a read threshold voltage value, the left strobe can be another read threshold voltage value that is decreased (i.e., offset) an amount from the read threshold voltage value of the center strobe, and the right strobe can be another read threshold voltage that is increased another amount from the read threshold voltage value of the center strobe. Although each offset strobe is of the same data, each offset strobe is influenced by different read noise and the use of multiple strobes can result in each bit of the data being influenced differently by the noise. In this regard, the different read noise of each of the multiple strobes can cause one or more bits of the data to "flip" values (e.g., change from a 0 value to a 1 value, or vice versa), thereby cause errors and increasing the BER.

Aspects of the present disclosure address the above and other deficiencies by performing a read sample offset most probable bit operation (also referred to as a "most probable bit operation") to determine the most probable bits or bit sequence for multiple offset strobes. Since each of the reads in the read sample offset are of the same data and each returns a bit error count, a most probable bit operation is executed using the data bits between multiple reads (e.g., the left strobe, the center strobe, and the right strobe) to produce a most probable value of the data (e.g., the sequence of bits of the data) corresponding to a minimum BER. The most probable bit operation includes a voting operation of the data bits between the multiple reads (e.g., three or more reads) to generate a most probable bit value among differing bit value results from the multiple reads. Advantageously, error detection can be performed on the most probable bit sequence. As such, the identification of a most probable bit reduces the BER by addressing errors or differences between the multiple reads caused, for example, by random noise associated with the memory sub-system.

Each of the multiple offset strobes (e.g., left, center, and right) produces a corresponding bit sequence (e.g., a left offset strobe bit sequence, a center offset strobe bit sequence, and a right offset strobe bit sequence). Although the multiple offset strobes read the same data, discrepancies or differences in one or more of the bit values of the bit sequences can be different for the various offsets due to random noise from the memory sub-system. Advantageously, using the most probable bit operation of the present disclosure identifies the discrepancies in the one or more bit values of the multiple bit sequences corresponding to the multiple offset strobes and executes a voting operation to determine a most probable bit value and correct bit errors due to memory sub-system noise.

By performing the most probable bit operation to the bit sequences corresponding to the left read sample, the center read sample, and the right read sample, the raw data of 1s and 0s from the multiple read samples are analyzed and the most probable bit values for the sequence of bits.

Advantages of the present disclosure include, but are not limited to, an improved system in which different bit values corresponding to multiple strobes can be identified and a most probable or likely bit value can be determined without the need of an ECC decoder as done conventionally. According to aspects of the present disclosure, the most probable bit operation can be designed as a logic operation in the memory sub-system. The most probable bit operation leverages data provided by the multiple offset strobes of the RSO operation to correct bit errors due to random noise associated with the memory sub-system. Determining the most probable values for the bit sequence corresponding to the data at the memory sub-system can enable many additional operations without the need to send data for ECC decoding or a code rate impact associated with the conventional use of repetition code (e.g., wherein multiple copies of the bits are written and read back at later time). In addition, another advantage of the present disclosure includes, but is not limited to, an improved performance of the memory sub-system since the most probable sequence of bits is identified to produce a lower BER as compared to a BER produced using a single offset strobe. In addition, the offset values are tunable to enable optimization of the performance of the one or more memory components (e.g., a lower BER) to counteract the noise associated with the one or more memory components.

Figure 1:
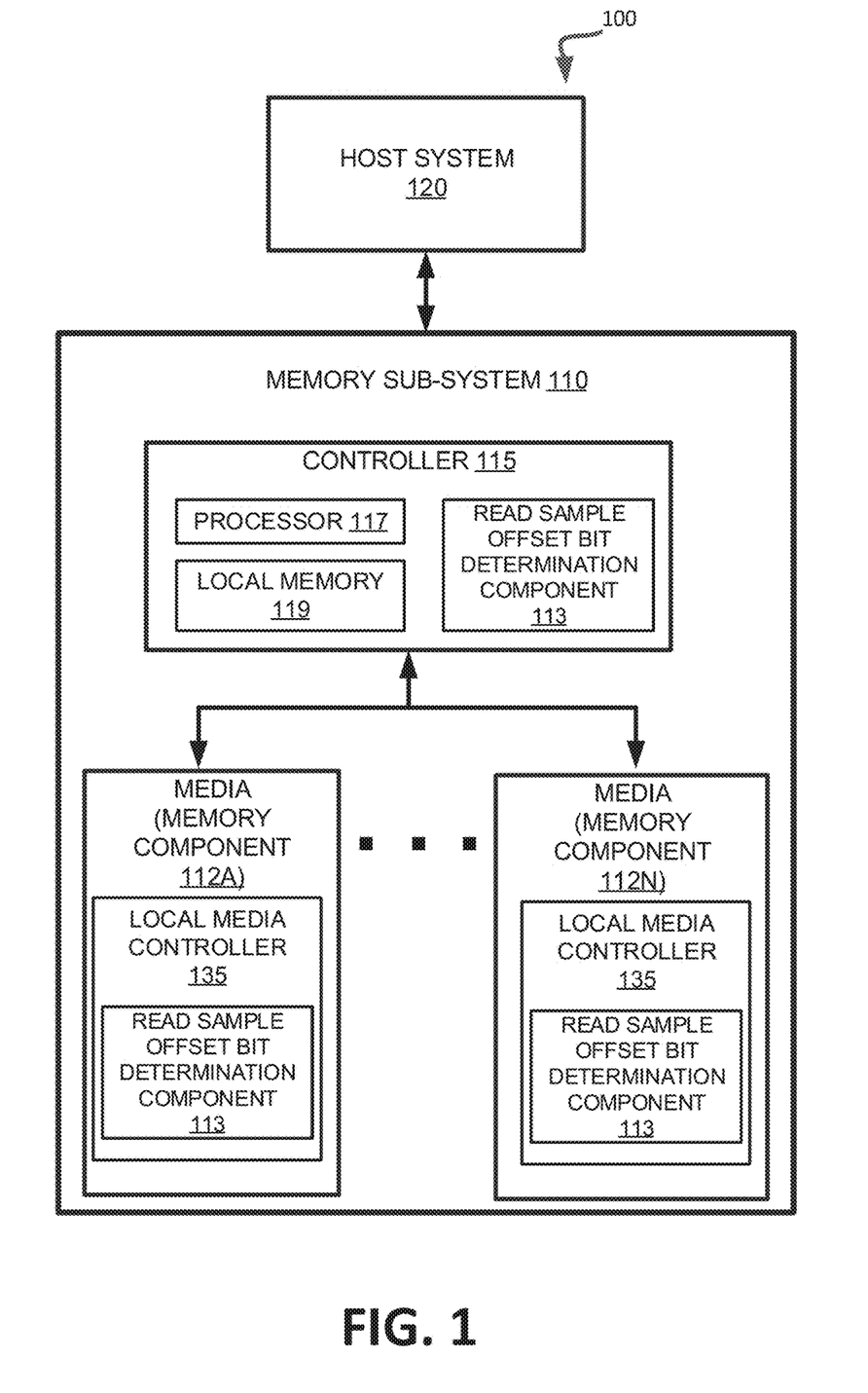
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a NAND type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a read sample offset bit determination component 113. In some embodiments, the controller 115 includes at least a portion of the read sample offset bit determination component 113. For example, the controller 115 can include a processor 117 (processing device) configured to execute instructions stored in local memory 119 for performing the operations described herein. Alternatively, the controller 115 includes circuits to implement the operations described herein. In some embodiments, the host system 120 can include a portion of the read sample offset bit determination component 113, such as described herein, where the most probable bit operation can be performed at the host system 120.

The read sample offset bit determination component 113 can perform multiple offset strobes (e.g., a left offset strobe, a center offset strobe, and a right offset strobe) to read data from the memory components 112A to 112N. In an embodiment, the multiple offset strobes can perform a first read using a first center value corresponding to a first read level threshold (i.e., the center offset strobe), a second read of the same data using a lower offset value relative to the first center value (i.e., the left offset strobe), and a third read of the same data using a positive offset value that is higher than the center value (i.e., the right offset strobe). The read sample offset bit determination component 113 can collect the raw data (e.g., a stream of data bits) associated with each of the multiple offset strobes) to identify a left offset raw data set, a center offset raw data set, and right offset raw data set. The read sample offset bit determination component 113 can execute a voting operation based on the raw data of 1s and 0s from each raw data sets to identify a most probable bit sequence associated with the data. The read sample offset bit determination component 113 can determine the most probable bit sequence based on the multiple offset strobes to address any discrepancy or difference in the bit values in the raw data sets that are due to random noise in the memory sub-system 110. In one embodiment, the read sample offset bit determination component 113 includes a logic circuit to perform the most probable bit operation including the voting operation (e.g., a simple majority detection logic operation) to determine the most probable sequence of bits associated with data.

As described herein, in one embodiment, the memory components 112A to 112N include local media controllers 135. In an embodiment, the local media controllers 135 can operate in conjunction with memory sub-system controller 115 to execute operations on one or more memory cells of the memory components 112A-112N. For example, the memory components 112A to 112N are NAND memory devices and include NAND controllers. The local media controllers 135 can include a read sample offset bit determination component 113. A local media controller 135 (e.g., NAND controller) can perform the multiple read sample offset strobes on the one or more memory components 112A to 112N identify the multiple raw data sets. The local media controller 135 can execute the voting operation on a bit-by-bit based on the multiple raw data sets (e.g., the bit sequences corresponding to the left, center, and right offset strobes) without the use of an ECC decoder of the memory sub-system controller 115. As noted herein, the BER corresponding to the most probable bit sequence identified by the read sample offset bit determination component 113 can exceed a correction capability of the ECC decoder. Furthermore, the BER corresponding to the most probable bit sequence identified by the read sample offset bit determination component 113 is lower than a BER associated with a single strobe.

Figure 2:
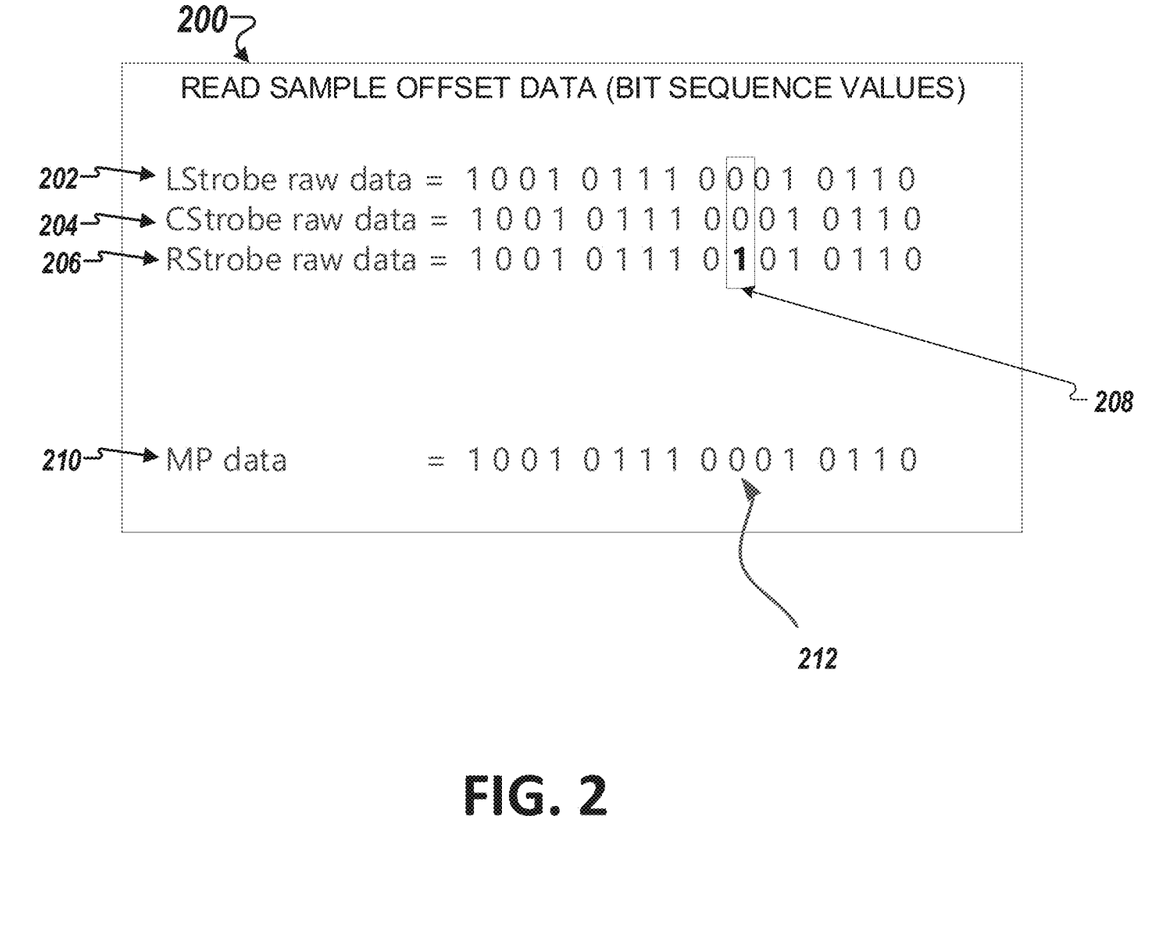
FIG. 2 illustrates example read sample offset data corresponding to multiple offset strobes, in accordance with some embodiments of the present disclosure.

FIG. 2 illustrates an example of read sample offset data 200 associated with a memory component (e.g., memory components 112A to 112N in FIG. 1) identified by the read sample offset bit determination component 113. In this example, multiple offset strobes including a left strobe (LStrobe), a center strobe (CStrobe) and a right strobe (RStrobe) are performed to produce respective sets of raw data. As shown, the LStrobe produces a first raw data set (LStrobe raw data 202), the CStrobe produces a second raw data set (CStrobe raw data 204), and the RStrobe produces a third raw data set (RStrobe raw data 206). Since the three offset strobes are based on the same data, without the influence of noise, the resulting raw data sets (i.e., the bit sequences) would be equal. However, due to noise, one or more of the corresponding bit values can be different among the three raw data sets. Furthermore, computing the most probable bit sequence also addresses issues relating to a probability of a bit being a zero or a one can be dependent on where the bit is sampled. For example, in a perfect valley, the center sample can have as many zero error bits as one error bits. By sampling at a lower offset, more zero error bits can be obtained. In addition, by sampling at a higher offset, more one error bits can be obtained. In an embodiment, identification of the most probable bit sequence optimizes the change in probability with sample offset of a bit being a zero value or a one value.

In the example shown in FIG. 2, a first discrepancy 208 in the bit values of the multiple data sets 202, 204, 206 is identified. In particular, the RStrobe raw data 206 includes a bit value of "1" corresponding to the $10^{th}$ position in the bit sequence, while the LStrobe raw data 202 and the CStrobe raw data 204 each include a "0" bit value for the corresponding position of the bit sequence.

Figure 3:
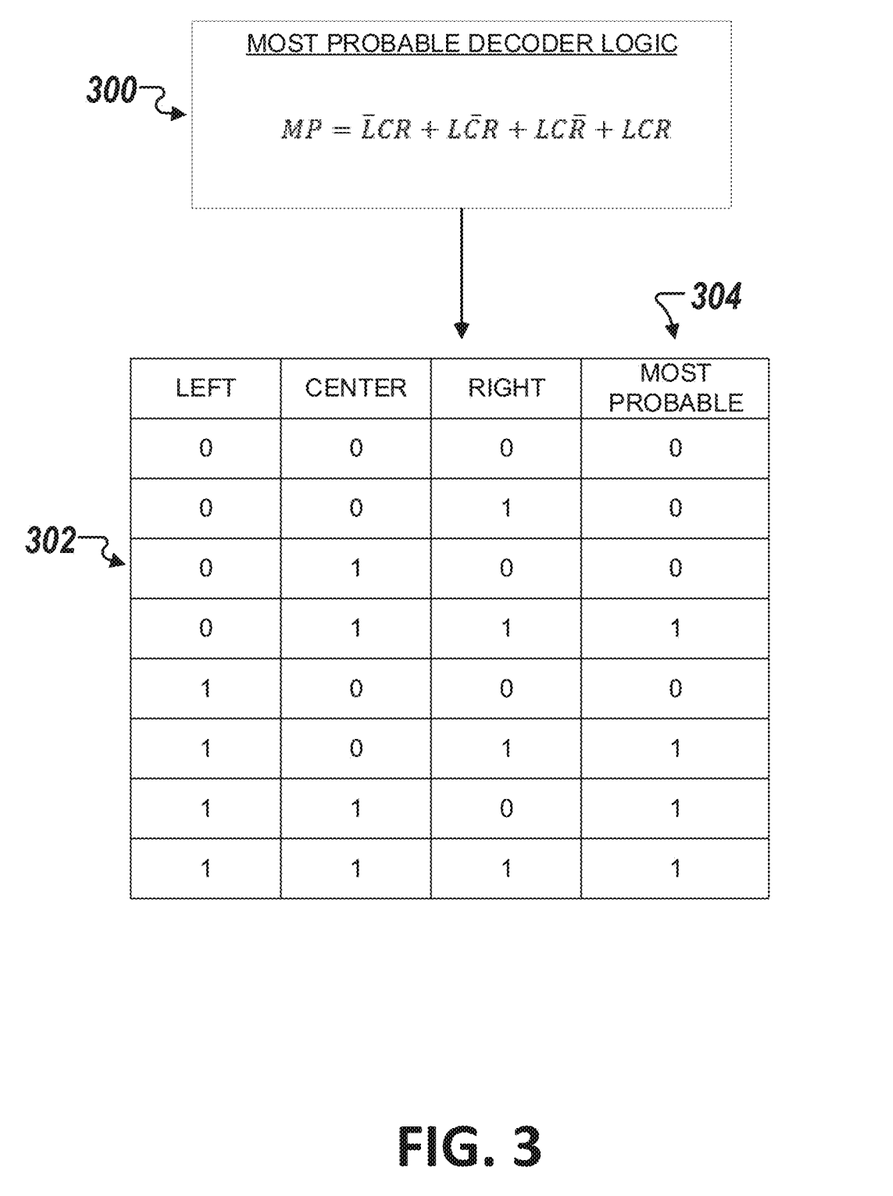
FIG. 3 illustrates example most probable decoder logic of a read sample offset most probable bit operation executable to determine most probable bit values based on multiple offset strobes, in accordance with some embodiments of the present disclosure.

In an embodiment, the read sample offset bit determination component generates a most probable bit sequence 210 (also referred to as the "MP data") by applying a voting operation to the LStrobe raw data 202, the CStrobe raw data 204, and the RStrobe raw data 206, as described in greater detail with respect to FIG. 3. As shown, the voting operation (e.g., a simple majority voting operation) of the values corresponding to the first discrepancy (0, 0, 1) is a "0" value 212.

FIG. 3 illustrates example 3-bit most probable decoder logic 300 executable by the read sample offset bit determination component of the present disclosure. In an embodiment, the most probable decoder logic 300 represents an example voting operation (e.g., a simple majority detection logic operation) executed to identify a most probable bit value associated with multiple strobes in accordance with the following equation:

$$\text{Most Probable Bit Value (MP)} = \bar{L}CR + L\bar{C}R + LC\bar{R} + LCR$$

wherein L represents a bit value corresponding to the left strobe, R represents a bit value corresponding to the right strobe, C represents a bit value corresponding to the center strobe, $\bar{L}$ represents a complement of the bit value corresponding to the left strobe, $\bar{C}$ represents a complement of the bit value corresponding to the center strobe, and $\bar{R}$ represents a complement of the bit value corresponding to the right strobe.

In an embodiment, asymmetric offsets can be employed (e.g., a sidewall slope), wherein a probability of a bit error as a function of an offset can be different between the left and right side of the valley. Accordingly, asymmetric sampling of the left and right sides of the valley can be employed.

As illustrated, the most probable decoder logic 300 can be applied to generate an output table 302 including most probable (MP) bit values 304 corresponding to the 3-bit (e.g., left, center, and right bit) combinations of data generated by left, center, and right offset strobes.

Figure 4:
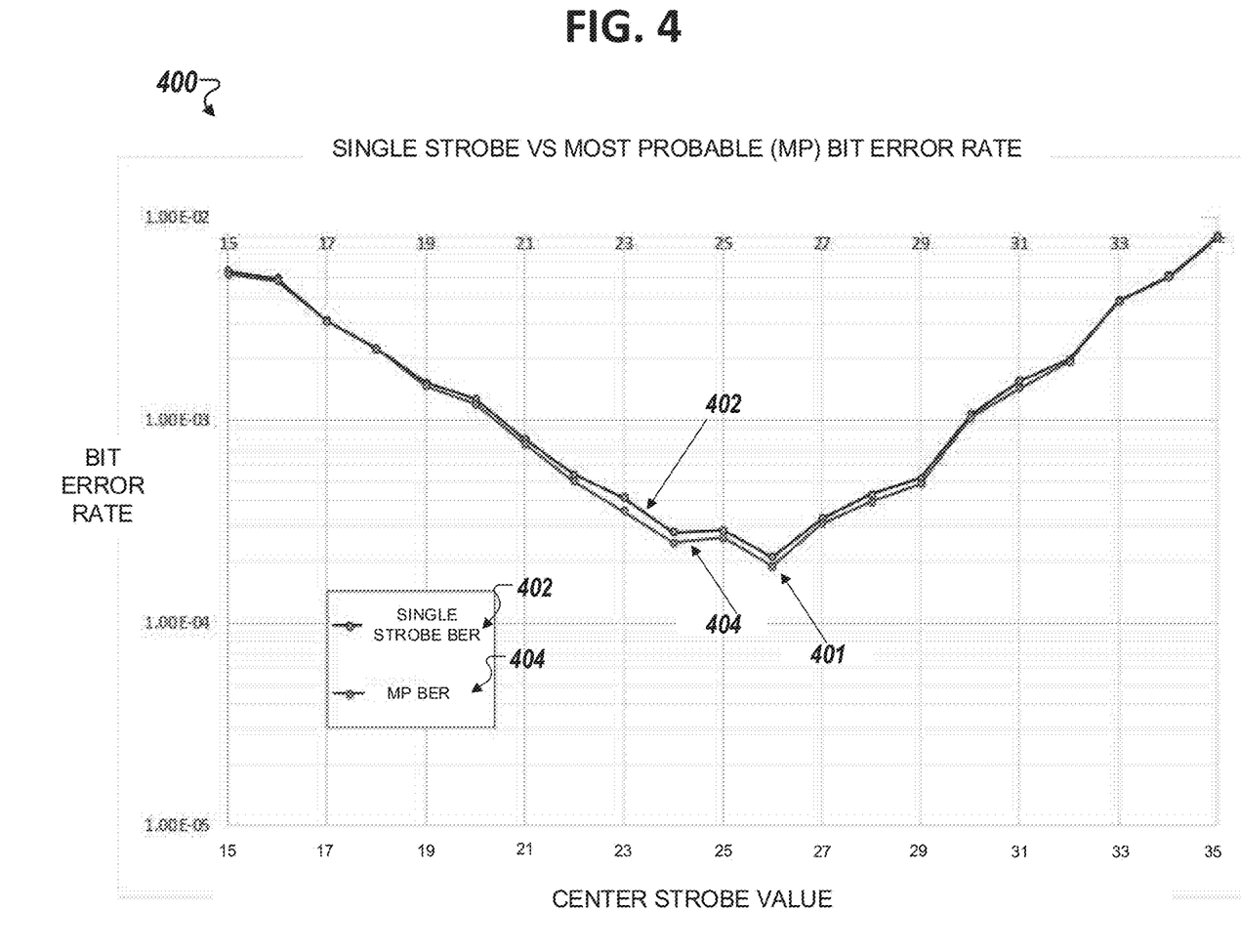
FIG. 4 is a graph illustrating a read sample offset sweep for comparing a bit error rate corresponding to a single strobe read and multiple strobe reads processed by a most probable bit operation, in accordance with some embodiments of the present disclosure.

FIG. 4 is a graphical representation 400 comparing a BER associated with a single strobe read sample 402 and a BER associated with a three strobe read sample 404 processed by a read sample offset bit determination component according to embodiments of the present disclosure. As illustrated, the graph 400 includes a first curve 402 representing an offset sweep corresponding to conventional single (center) strobe processing. The graph also includes a second curve 404 representing an offset sweep corresponding to three strobe most probable bit processing of the present disclosure. As shown, the X-axis of graph 400 represents an offset value relative to a valley 401 centered at a center offset value of approximately 26. Each point on the single strobe BER curve 402 represents data from a center strobe. Each point on the most probable BER curve 404 represents data from a three strobe processed by the read sample offset bit determination component to determine the corresponding MP value (e.g., as illustrated in FIG. 3). In an embodiment, BER values are computed for each data point on the single strobe curve and each point on the three strobe curve. As illustrated by the example data shown in graph 400, the MP BER curve 404 produces a lower (e.g., better) BER as compared to the single strobe BER curve 402.

Figure 5:
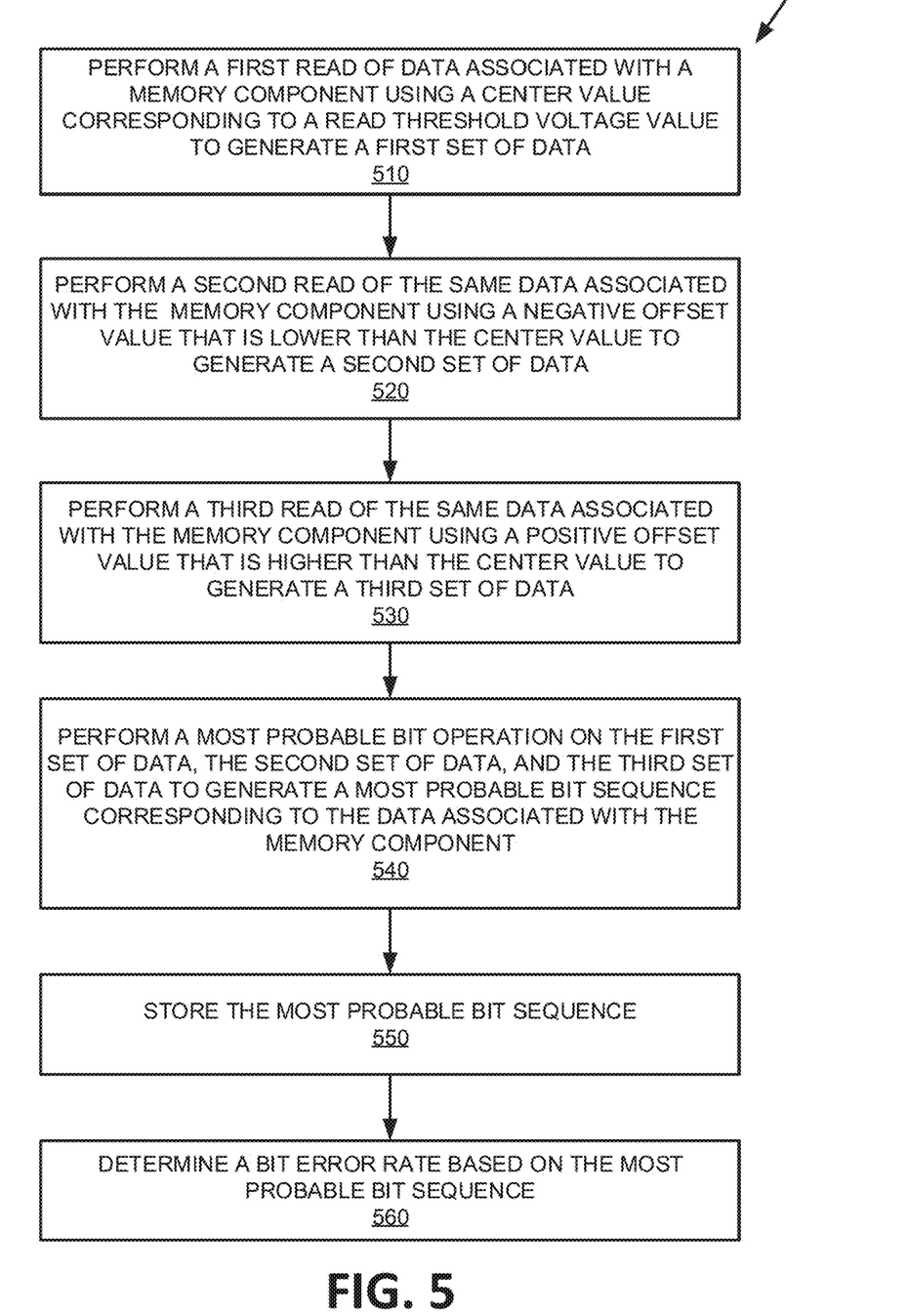
FIG. 5 is a flow diagram of an example method to perform a read sample offset most probable bit operation in accordance with some embodiments of the present disclosure.

FIG. 5 is a flow diagram of an example method 500 to perform a most probable bit operation in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read sample offset bit determination component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device performs a first read of data associated with one or more memory devices using a first center value corresponding to a first read level threshold to generate a first set of data. In an embodiment, the first read or center strobe produces the first set of data including a first sequence of bit values corresponding to the data from the one or more memory devices. In an embodiment, the processing device stores the first set of data including the first sequence of bit values. In an embodiment, the strobes are executed for calibration at a cadence (e.g., a cadence of seconds to minutes). In an embodiment, two strobes can be performed on every read.

At operation 520, the processing device performs a second read of the same data associated with the one or more memory devices using a negative offset value that is lower than the center value to generate a second set of data. In an embodiment, the second read or left offset strobe produces the second set of data including a second sequence of bit values corresponding to the data from the one or more memory devices. In an embodiment, the processing device stores the second set of data including the second sequence of bit values.

At operation 530, the processing device performs a third read of the same data associated with the one or more memory devices using a positive offset value that is higher than the center value to generate a third set of data. In an embodiment, the third read or right offset strobe produces the third set of data including a third sequence of bit values corresponding to the data from the one or more memory devices. In an embodiment, the processing device stores the third set of data including the third sequence of bit values. In an embodiment, the offset values (e.g., the center value, the negative offset value, and the positive offset value) are tunable to optimize performance of the one or more memory devices (e.g., lower the BER) to counteract or account for a noise level corresponding to the one or more memory devices.

At operation 540, the processing device performs a most probable bit operation on the first set of data, the second set of data, and the third set of data to generate a most probable bit sequence corresponding to the data associated with the one or more memory devices. In an embodiment, the most probable bit operation includes a voting operation (e.g., performed on a bit-by-bit basis on corresponding bits of the first set of data, the second set of data, and the third set of data). In an embodiment, the most probable bit operation compares a first value of a bit in the first set of data, a second value of the same bit (e.g., the same bit position in the bit sequence) in the second set of data, and the third value of the same bit in the third set of data. In an example, the first value, the second value, and the third value can be a value of either '0' or '1' and those values are processed in accordance with the simple majority detection logical operation to generate a most probable bit sequence including a most probable (e.g., the simple majority value based on the three bit values from the respective strobes corresponding to the same position in the respective bit sequences). In an embodiment, for each bit position (i.e., on a bit-by-bit basis), the most probable bit operation determines a most probable bit value in accordance with the most probable decoder logic, as illustrated in FIG. 3. In an embodiment, the most probable bit operation is performed on the bit streams corresponding to the three reads as the bit streams are transmitted by the memory component, and the most probable bit sequence is transmitted to the ECC decoder.

At operation 550, the processing device stores the most probable bit sequence. At operation 560, the processing device determines a BER based on the most probable bit sequence. In an embodiment, the determined BER corresponding to the most probable bit sequence is lower than a BER associated with a single strobe read of the data associated with the one or more memory devices, as illustrated in the graph shown in FIG. 4. In an embodiment, the BER can be derived from a number of bits that are flipped by the ECC decoder. In another embodiment, the BER can be determined using a read sample offset exclusive-or (RSOXOR) method, wherein an XOR operation is performed on the three reads and voted on to determine the most probable bit sequence.

In a further embodiment, the processing logic is part of a local media controller 135 (e.g., NAND controller), and the local media controller 135 performs the most probable bit operation. In an embodiment, the processing logic of the local media controller 135 outputs the most probable bit sequence to the memory sub-system controller 115. In an embodiment, the most probable bit operation is processed by the local media controller 135, without intervention by the memory sub-system controller 115 (e.g., an ECC decoder executed by the memory sub-system controller 115).

In another embodiment, the processing logic is part of a host system and performs some or all of the most probable bit operation.

Figure 6:
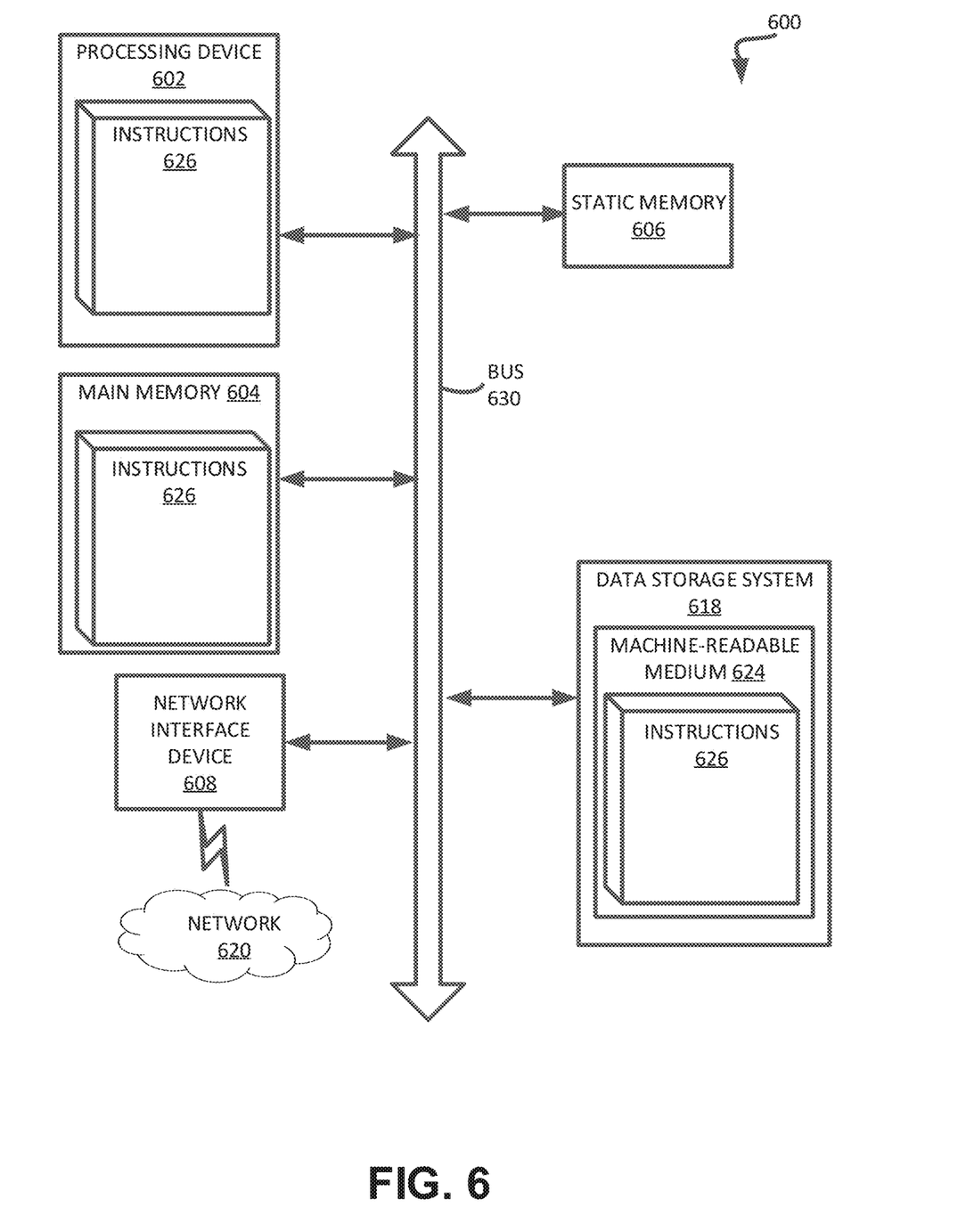
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read sample offset bit determination component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a caching component (e.g., the read sample offset bit determination component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A non-transitory computer-readable storage medium structured to store instructions executable by a processing device, the instructions, when executed cause the processing device to perform operations comprising:
   performing a first read of data associated with a memory component using a first strobe having a center value corresponding to a read threshold voltage value to generate a first set of data comprising a first sequence of bit values;
   performing a second read of the data associated with the memory component using a second strobe having a negative offset value that is lower than the center value to generate a second set of data comprising a second sequence of bit values;
   performing a third read of the same data associated with the memory component using a positive offset value that is higher than the center value to generate a third set of data comprising a third sequence of bit values;
   performing a most probable bit operation to compare the first sequence of bit values, the second sequence of bit values, and the third sequence of bit values to generate a most probable bit sequence corresponding to the data associated with the memory component; and
   causing the most probable bit sequence to be stored.

2. The non-transitory computer-readable storage medium of claim 1, wherein a bit position of at least one of the first sequence of bit values or the second sequence of bit values has a first bit value that differs from a second bit value of the bit position of the third sequence of bit values.

3. The non-transitory computer-readable storage medium of claim 1, wherein the most probable bit operation comprises performing a majority detection logical operation on bit values of a same bit of the first bit sequence, the second bit sequence, and the third bit sequence.

4. The non-transitory computer-readable storage medium of claim 1, wherein the negative offset value is a decrease of the read threshold voltage value associated with the first read of the data.

5. The non-transitory computer-readable storage medium of claim 1, wherein the positive offset value is an increase of the read threshold voltage value associated with the first read of the data.

6. The non-transitory computer-readable storage medium of claim 1, wherein the operations further comprise determining a bit error rate based on the most probable bit sequence.

7. A method comprising:
   receiving a first set of read data associated with a memory component, the first set of read data generated using a first read strobe at a first read threshold voltage value, wherein the first set of read data comprises a first bit sequence;
   receiving a second set of read data associated with the memory component, the second set of read data generated using a second read strobe at a second read threshold voltage value, wherein the second set of read data comprises a second bit sequence;

receiving a third set of read data associated with the memory component, the third set of read data generated using a third read threshold voltage value, wherein the third set of read data comprises a third bit sequence;

determining a first bit value of a first bit position of the first bit sequence;

determining a second bit value of the first bit position of the second bit sequence;

determining a third bit value of the first bit position of the third bit sequence;

determining a difference between the first bit value, the second bit value, and the third bit value; and executing, by a processing device, a most probable bit operation on the first bit value, the second bit value, and the third bit value, a most probable bit sequence corresponding to the data associated with the memory component.

8. The method of claim 7, wherein the second read threshold voltage value is a negative offset value that is lower than the first read threshold voltage value.

9. The method of claim 7, wherein the third read threshold voltage value is a positive offset value that is higher than the first read threshold voltage value.

10. The method of claim 7, wherein the processing device comprises a logic circuit to perform the most probable bit operation.

11. The method of claim 7, wherein the processing device comprises a NAND controller and the memory component comprises a NAND memory component.

12. The method of claim 7, wherein the processing device is further to determine a bit error rate based on the most probable bit sequence.

13. A method comprising:

performing a first read of data associated with a memory component using a first strobe having a center value corresponding to a read threshold voltage value to generate a first set of data comprising a first sequence of bit values;

performing a second read of the same data associated with the memory component using a second strobe having a negative offset value that is lower than the center value to generate a second set of data comprising a second sequence of bit values;

performing a third read of the same data associated with the memory component using a positive offset value that is higher than the center value to generate a third set of data comprising a third sequence of bit values;

performing, by a processing device, a most probable bit operation to compare the first sequence of bit values, the second sequence of bit values, and the third sequence of bit values to generate a most probable bit sequence corresponding to the data associated with the memory component; and causing the most probable bit sequence to be stored.

14. The method of claim 13, wherein a bit position of at least one of the first bit sequence or the second bit sequence has a first bit value that differs from a second bit value of the bit position of the third bit sequence.

15. The method of claim 13, wherein the most probable bit operation comprises performing a majority detection logical operation on bit values of a same bit of the first bit sequence, the second bit sequence, and the third bit sequence.

16. The method of claim 13, wherein the processing device comprises a logic circuit to perform the most probable bit operation.

17. The method of claim 13, wherein the processing device is a NAND controller and the memory component is a NAND memory component.

\* \* \* \* \*